US012674828B2

(12) United States Patent
Dawson

(10) Patent No.: US 12,674,828 B2
(45) Date of Patent: Jul. 7, 2026

(54) ELECTRICAL IMPEDANCE SPECTROSCOPY

(71) Applicant: ELECTRIC HYDROGEN CO., Natick, MA (US)

(72) Inventor: Tyler Dawson, Walnut Creek, CA (US)

(73) Assignee: ELECTRIC HYDROGEN CO., Devens, MA (US)

( * ) Notice: Subject to any disclaimer, the term of this patent is extended or adjusted under 35 U.S.C. 154(b) by 134 days.

(21) Appl. No.: 18/691,694

(22) PCT Filed: Apr. 26, 2023

(86) PCT No.: PCT/US2023/020053
§ 371 (c)(1),
(2) Date: Mar. 13, 2024

(87) PCT Pub. No.: WO2023/212106
PCT Pub. Date: Nov. 2, 2023

(65) Prior Publication Data
US 2025/0123312 A1      Apr. 17, 2025

Related U.S. Application Data

(60) Provisional application No. 63/335,501, filed on Apr. 27, 2022.

(51) Int. Cl.
*G01R 27/02*          (2006.01)
(52) U.S. Cl.
CPC ................................... *G01R 27/02* (2013.01)
(58) Field of Classification Search
CPC ..................................................... G01R 27/02
See application file for complete search history.

(56) References Cited

U.S. PATENT DOCUMENTS

| | | | | | |
|---|---|---|---|---|---|
| 10,018,613 | B2 * | 7/2018 | Potyrailo | ........... | G01N 33/2888 |
| 11,740,272 | B2 * | 8/2023 | Zhou | ................ | G01R 31/31905 |
| | | | | | 324/756.02 |
| 2008/0048677 | A1 | 2/2008 | Tan et al. | | |
| 2017/0254844 | A1 | 9/2017 | Sestok, IV | | |
| 2017/0254871 | A1 | 9/2017 | Sestok, IV | | |

(Continued)

FOREIGN PATENT DOCUMENTS

CN          114199947 A        3/2022

OTHER PUBLICATIONS

Written Opinion of the International Searching Authority for PCT/US2023/020053, mailed Jun. 30, 2023, pp. 1-11.

(Continued)

*Primary Examiner* — Reena Aurora
(74) *Attorney, Agent, or Firm* — Lempia Summerfield Katz LLC

(57) ABSTRACT

A device may perform impedance spectroscopy on a component under test. The frequency response analyzer circuitry may be coupled to the component under test outside of a current loop supplying an operational current to the component under test. The frequency response analyzer circuitry may drive a variable impedance circuit to generate an oscillating current component within the current loop. The frequency response analyzer circuitry may monitor a frequency response of the component under test to the oscillating current component.

20 Claims, 4 Drawing Sheets

(56) References Cited

U.S. PATENT DOCUMENTS

| | | |
|---|---|---|
| 2018/0180652 A1 | 6/2018 | Sestok, IV et al. |
| 2022/0074980 A1 | 3/2022 | Chao et al. |

OTHER PUBLICATIONS

Extended European Search Report for European Application No. 23797234.4, mailed Apr. 8, 2026, pp. 1-12.
Roberto Lo Presti et al., "Development of Electrochemical Impedance Spectroscopy Instrument For Survey On Fuel Cell," Environment and Electrical Engineering (EEEIC), 2012 11th International Conference On IEEE, May 18, 2012, pp. 1-7.

* cited by examiner

200

Drive variable impedance circuit to generate oscillating current component.    202

Perform monitoring of frequency response.    204

Vary frequency of oscillating current component.    206

Monitor the component under test while frequency is varied.    208

300

304          306          308

Power
source

102

312

Frequency
Response Analyzer          110
Circuitry

ELECTRICAL IMPEDANCE SPECTROSCOPY

PRIORITY

This application is a § 371 nationalization of PCT Application Serial No. PCT/US2023/020053, filed Apr. 26, 2023, designating the United States, which claims priority to U.S. Provisional Application No. 63/335,501, filed Apr. 27, 2022, and titled ELECTRICAL IMPEDANCE SPECTROSCOPY, which are incorporated by reference herein in their entireties.

FIELD

The following disclosure relates electrical impedance spectroscopy.

BACKGROUND

Electrolyzer systems use electrical energy to drive a chemical reaction. For example, water is split to form hydrogen and oxygen. The products may be used as chemical feedstocks and/or energy sources. In recent years, improvements in operational efficiency have made electrolyzer systems competitive market solutions for energy storage, generation, and/or transport. For example, the cost of generation may be below $10 per kilogram of hydrogen in some cases. Decreases in cost, increases in efficiency, and/or improvements in operation will continue to drive installation of electrolyzer systems.

BRIEF DESCRIPTION OF THE DRAWINGS

Example implementations are described herein with reference to the following drawings.

DETAILED DESCRIPTION

In various contexts, it may be desirable to determine the frequency response spectrum of various electrical components to characterize the condition of the components. In some scenarios, it may be desirable to characterize the in-operation condition of the components. However, in some cases, the current cycled through the component during nominal operation may, according to the conventional wisdom, call for a specialized frequency response analyzer capable of handling the operational current while in line with the electrical component being characterized. For example, electrochemical membranes, electrochemical processes, and/or electrochemical cells (and other electrochemical assemblies) may operate in conditions of high current throughput. In some cases, such high current throughput may exceed the operation current capacity of a frequency response analyzer system.

Contrary to the conventional wisdom, the techniques and architectures discussed herein may allow for frequency response analyzer circuitry that is placed outside of the current loop of the component under test (e.g., the electrical component being characterized). Thus, the frequency response analyzer circuitry need not necessarily handle the current cycling in the loop during nominal operation. For example, the operational current may vary from a few amps up to multiple thousands of amps for components used in electrochemical processes.

The techniques and architectures are discussed herein with regard to electrochemical process component for the purposes of illustration and to highlight select advantages of the system with regard to high-current applications and/or remote/centralized component testing. However, the techniques and architectures may be used to perform electrical impedance spectroscopy on virtually any electrical component. Additionally or alternatively, the techniques and architectures are useful in a wide variety of in vivo applications because specialized testing components need not necessarily be installed in operational lines. Rather, as discussed herein, components may be installed in parallel to nominal operational loops and/or at characterization tap points outside of operating current loops. For example, the frequency response analyzer circuitry discussed herein may couple to a component under test outside a current loop at tap points that allow observation of the frequency response without necessarily placing a current load and/or a substantial current load on the frequency response analyzer circuitry, thereby requiring specialized structures for handling.

Figure 1:
FIG. 1 shows an example impedance spectroscopy device.
Figure 1:
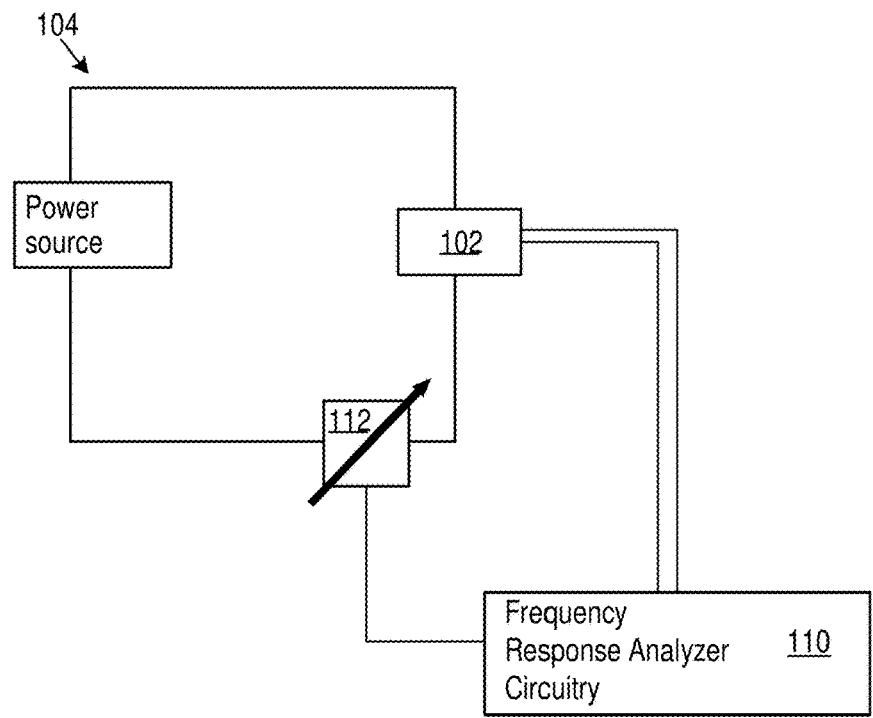
Figure 2:
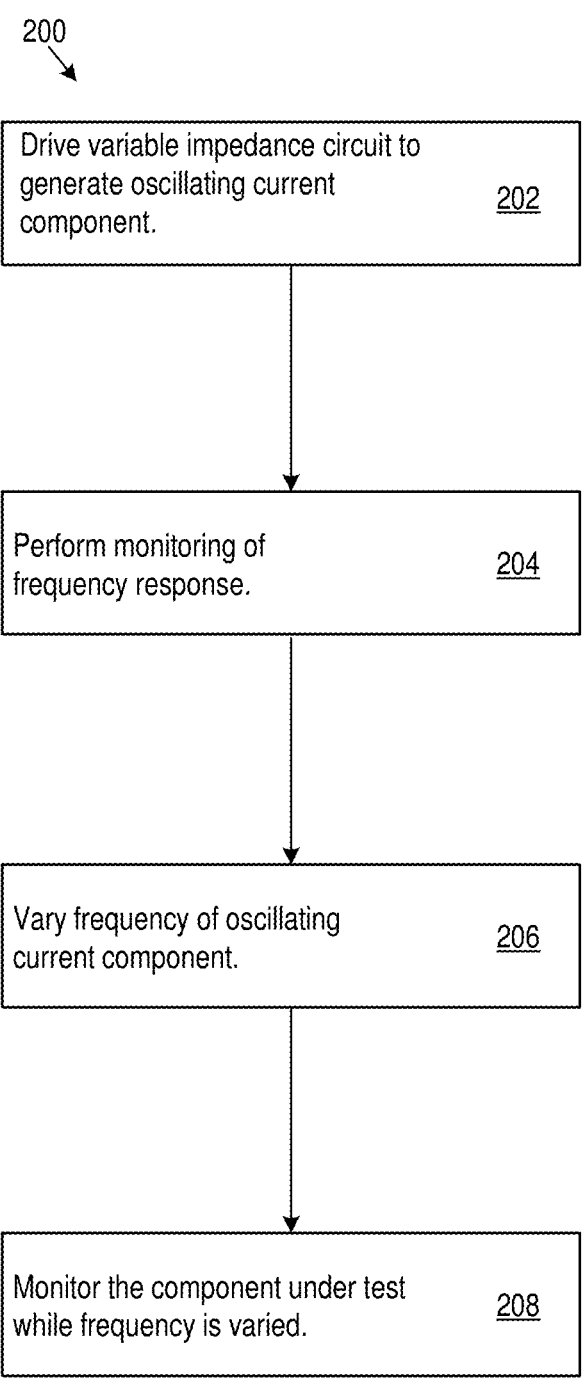
FIG. 2 shows example response analyzer logic.

FIG. 1 shows an example impedance spectroscopy device 100. The impedance spectroscopy device may include frequency response analyzer circuitry 110 which may monitor a frequency response from a component under test 102. Reference is also made to FIG. 2 which shows example response analyzer logic (RAL) 200, which may control operation of the frequency response analyzer circuitry 110.

The frequency response analyzer circuitry 110 may further be coupled to a variable impedance circuit 112. In the example impedance spectroscopy device 100, the variable impedance circuit coupled in series to the component under test 102 within a current loop 104 which may supply current (e.g., a nominal operation current) to the component under test 102. Therefore, the current passing through the component under test 102 also passes through the variable impedance circuit 112. However, other configurations are possible. For example, in various implementations, the variable impedance circuit 112 may receive less than all the current passing through the component under test 102. For example, in the second example impedance spectroscopy device 300 discussed below with respect to FIG. 3, the variable impedance circuit 312 may be coupled to the component under test 102 in parallel. Accordingly, the impedance balance between the two parallel paths may be selected such that a portion (in some case a small fraction, such as $\frac{1}{10}$, $\frac{1}{20}$, $\frac{1}{100}$, $\frac{1}{1000}$, or other fraction) of the current through the component under test 102 passes through the variable impedance circuit 112. Nevertheless, in some implementations, a series coupling is used and the entire current of the component under test is received by the variable impedance circuit.

In various implementations, the variable impedance circuit 112 may include a device with a controllable impedance such as a variable resistor.

The RAL 200 may cause the to drive the variable impedance circuit 112 (e.g., to alter a portion of its impedance) to generate an oscillating current component in the current loop 104 (202). The oscillating current component may cause a frequency response in the component under test 102, which may be monitored by the frequency response analyzer circuitry 110. In various implementations, the frequency response analyzer circuitry 110 may couple to the component under test 102 at tap points to allow the RAL 200 to perform monitoring (204) without current flow through the frequency response analyzer circuitry 110, for example via voltage monitoring or other monitoring. In some cases, frequency response analyzer circuitry 110 may have high internal resistance to prevent current from flowing through frequency response analyzer circuitry 110. In some cases, the frequency response analyzer circuitry 110 may be designed to allow a portion of the current passing through the component under test 102 to pass through the frequency response analyzer circuitry 110. However, because the frequency response analyzer circuitry 110 is outside the current loop 104, the selection of the amount of current allowed through the frequency response analyzer circuitry 110 may be selected independently of the operational requirements of the component under test. In various illustrative example use cases, the component under test 102 may include an electrochemical membrane, an electrochemical process, an electrochemical cell, an electrochemical assembly, and/or another portion of an electrochemical system. In some electrochemical use cases, the current may be up to 50-1000 amps or more. For system-wide analyses the current may be up to 10 k-100 k amps or more.

In various implementations, the RAL 200 still may act as a signal generator via an analog input to a variable resistor (or other variable impedance circuit) that allows the RAL 200 to control a perturbation in current loop 104. The RAL 200 may monitor the response at the component under test 102. Accordingly, the control of perturbation function and the signal analysis function may be isolated from one another.

The RAL 200 may cause the frequency response analyzer circuitry 110 to vary the frequency at which the variable impedance circuit 112 is being driven (206), e.g., to scan over a frequency range of interest. RAL 200 may continue to cause the frequency response analyzer circuitry 110 to monitor the component under test 102 while the frequency of the oscillating current component is varied (208) to obtain a frequency response spectrum for the component under test 102. Accordingly, the electrical impedance spectroscopy is performed on the component under test 102. The variable impedance circuit 112 may be selected/operated such that the oscillating current component is a portion of the full current in the current loop 104. For example, the oscillating current component may be a perturbative (for example, 1-2% or other percentage and/or fractional portion) amount of the full current.

In some cases, the variable impedance circuit 112 may be selected to have a static base load with a variable perturbative load to generate low relative magnitude oscillations in the current. For example, this ratio of the base load to the perturbative load may be selected such that it does not cause a change to the electrochemical behavior of the component under test. For example, the component under test may be characterized by a current-voltage (IV) curve. The perturbation magnitude may be selected such that the full oscillation range of the change can be approximated as linear changes (e.g., first order approximation) without necessarily accounting for nonlinear components. Accordingly, perturbation may be implemented that achieves a signal-to-noise ratio that supports frequency analysis, without necessarily using higher order models of the electrochemical behavior of the component under test.

In some implementations (e.g., implementations where the variable impedance circuit 112 is coupled parallel to the component under test), the path of the frequency response causes a phase shift with respect to the oscillating current component. In some cases, the phase shift may correspond to a reversal of the direction of current flow with respect to the oscillating current component. For example, the phase shift may be 180 degrees. Thus, in various implementations, the phase shift may be mitigated and/or otherwise accounted for before EIS is performed. In some cases, the path of the frequency response may include a phase-shifter to compensate for the phase shift. In some cases, the driving signal for the oscillating current component may be phase shifted before provision of this driving signal to the frequency response analyzer as a reference input. In some implementations, the frequency response analysis itself may account for the phase shift algorithmically. In some implementations, the polarity of the monitoring leads from the component under test may be reversed from the polarity defined for the oscillating current component (e.g., to provide a 180 degree phase shift).

The logic of the RAL 200 may be implemented on hardware, software, and/or a combination of hardware and software. For example various processors, application specific integrated circuits, microcontroller devices, and/or other processing units may be used to implement the logic. In some cases, the frequency response analyzer circuitry 110 may include a frequency response analyzer with human interface components and one or more functions of the RAL 200 may be performed via operator inputs to the frequency response analyzer.

Figure 3:
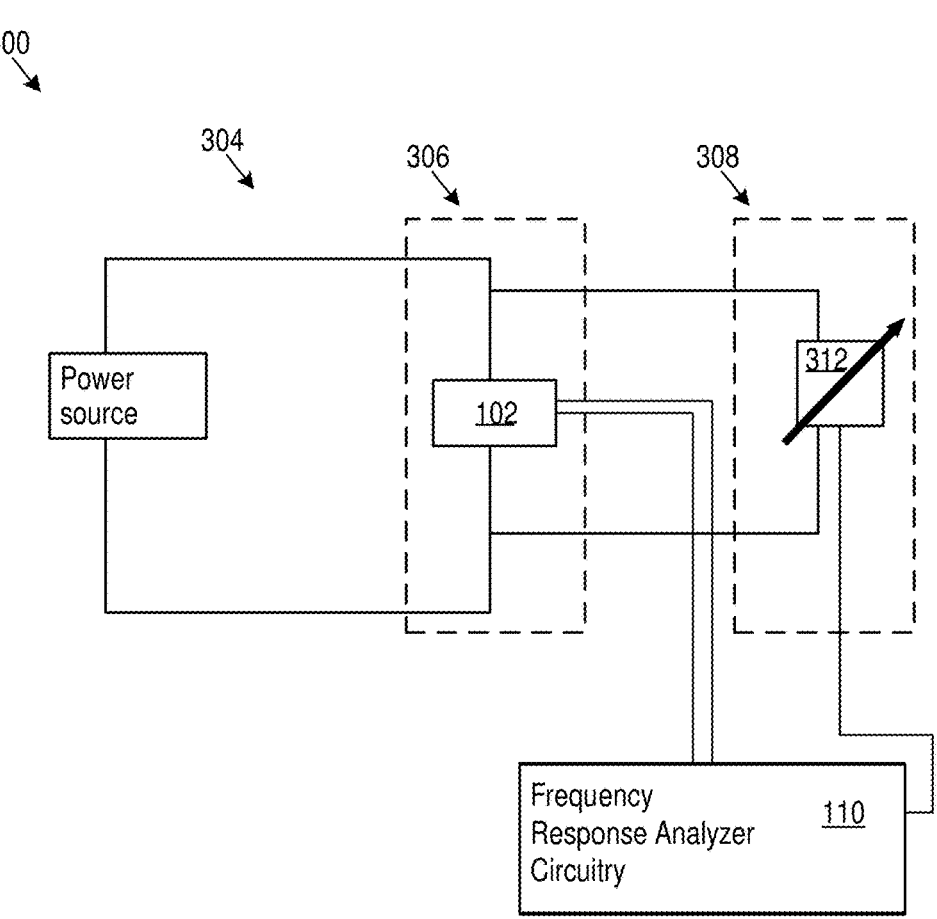
FIG. 3 shows a second example impedance spectroscopy device.

FIG. 3 shows a second example impedance spectroscopy device 300. In the second example impedance spectroscopy device 300, the variable impedance circuit 312 is coupled in parallel to the component under test 102. Accordingly, the current loop 304 has two paths 306, 308. The (e.g., static portion of) impedance of the variable impedance circuit 312 may be selected to control the relative scale of current in the loops. Accordingly, the second example impedance spectroscopy device 300 may be used in remote monitoring applications without necessarily inserting an in vivo variable impedance circuit into the operating current loop of the device including the component under test 102. Further, because the current through the variable impedance circuit 312 may be selected independently of the magnitude of the current through the component under test 102, large current applications may be accommodated without necessarily selecting a variable impedance circuit 312 capable of supporting passage of the full operating current.

Figure 4:
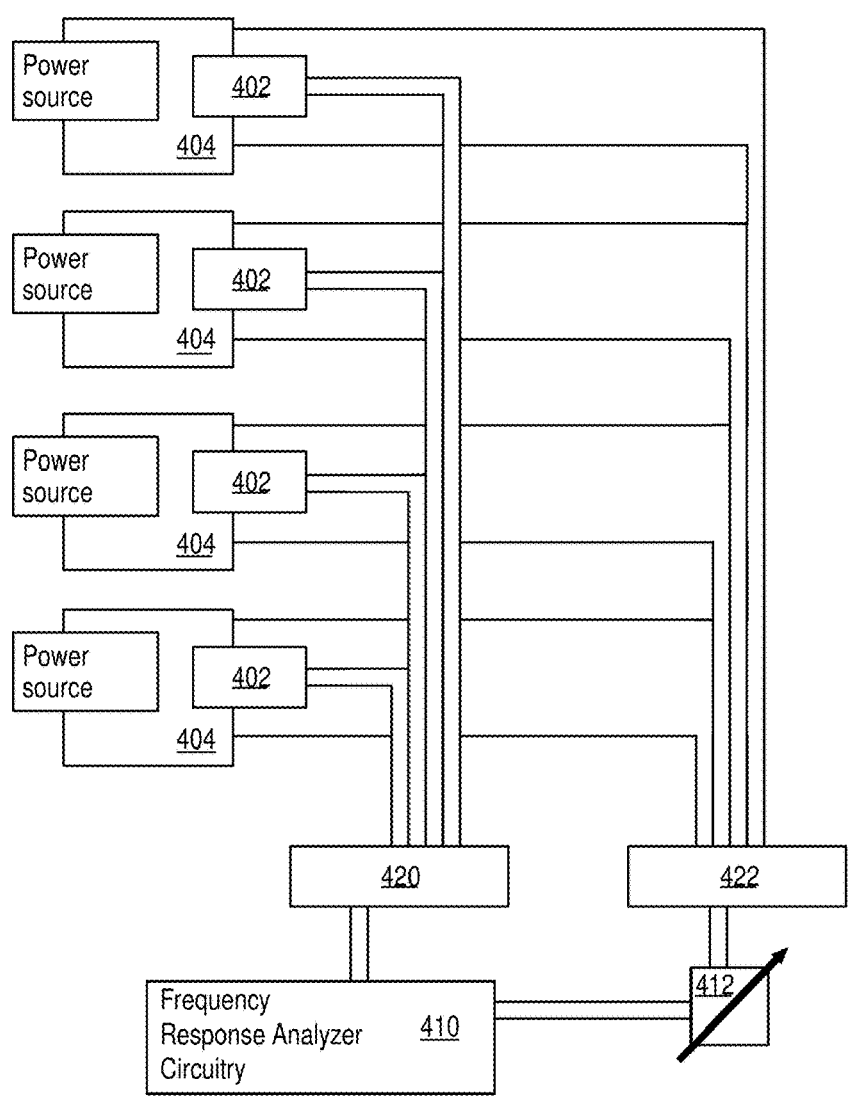
FIG. 4 shows a third example impedance spectroscopy device.

FIG. 4 shows a third example impedance spectroscopy device 400. The third example impedance spectroscopy device 400, may include one or more multiplexors 420, 422 to support multiplex coupling of the centralized frequency response analyzer circuitry 410 and/or variable impedance circuit 412 to multiple components under test 402 and current loops 404, respectively. In some cases, although not shown, dedicated (e.g., non-centralized) variable impedance circuits may be used for each of the components under test 402. The multiplexor 422 may be configured to couple the variable impedance circuit 412 to the current loops 404 in series (in some implementations) and/or in parallel (in some implementations). The multiplexor 422 may be selected to accommodate the full current loop current in some series configurations. Accordingly, in some cases, multiplexors with lower current ratings may be used when the coupling is parallel rather than series. The multiplexors may change among coupling to the various components under test 402 such that the single centralized frequency response analyzer circuitry 410 may characterize multiple components under test 402.

Although not shown, In some implementations, the various components under test 402 may each include a dedicated test station including one or more lead couplings or other testing ports to allow for additional modularity and reconfigurability of the system. Moreover, the dedicated test stations may facilitate the implementation of additional diagnostic testing when anomalous spectra are obtained for a given component under test. The dedicated test stations may be coupled for parallel variable impedance circuit (out-of-loop) EIS analysis and/or series variable impedance circuit (in loop) EIS analysis.

EXAMPLE IMPLEMENTATIONS

Various illustrative example implementations are discussed below. The illustrative example implementations are illustrative of the general architectures and techniques described above and in the claims below. Descriptions of particular features are included to clarify the relationship of that particular feature to the specific illustrative scenario/scenarios in which the particular feature is discussed. Such a relationship to the same degree may not apply without express description of such a relationship to other implementations. Nevertheless, such features described with respect to the individual example implementations may be readily integrated with other implementations with or without various other features present in the respective example implementation.

Electrolysis systems can operate at high currents, making impedance spectroscopy challenging when using frequency response analyzer as the power source feeding the electrolysis device. As recognized herein, if you pair an electronic load with the frequency response analyzer and run the circuit in parallel with the product circuit, the same analysis can be achieved at product operating current without having a frequency response analyzer as part of the series circuit.

In order to get "as-used" impedance spectroscopy data out of an electrolysis cell, it would be desirable, in some cases, to take measurements at the full operating current. Based on the electrolysis cell design, other electrochemical applications, and/or other industrial power applications, that current may be high, which may require costly accommodation if the frequency response analyzer exposed to the operating current. For some levels of current, no properly rated frequency response analyzers may exist. By paring an electronic load with the electrolysis circuit one can achieve the full operating current without making the frequency response analyzer part of the circuit.

In various scenarios, gathering impedance spectroscopy at a laboratory level can become time consuming, expensive, and/or impracticable depending on how measurements are gathered. In some systems, each test stand requires access to a frequency response analyzer to be in series with the DC circuit in order to attain full frequency range impedance spectroscopy data for the test article. The can be addressed by having a frequency response analyzer on each test stand. However, the cost of such implementations may increase quickly as the number of test stands increases. This can also be addressed using a portable frequency response analyzer. However, portable systems may, in some cases, rely on manual setup and operation. Thus, options for automation may be restricted.

Additionally or alternatively, one or more centralized frequency response analyzers and a distributed (e.g., lab-wide, site-wide, etc.) impedance spectroscopy system constructed around it that multiplexes a parallel DC circuit and sense wires to each test station can be implemented to address multi-point testing demand. At least part of the gained value is to have distributed EIS capability without installing individual electronic loads and frequency response analyzers for dedicated test stations.

Perturbation of the circuit may occur at the centrally located electronic load. The electronic load's current oscillations are controlled by the frequency response analyzer located in the same place. The voltage sense and current sense for the circuit may be located in different locations. However, to address line loss and/or series resistance of the lines a current transducer may be run on each test stand. Thus, the perturbation signal may be multiplexed in some implementations.

Table 1 includes various examples.

TABLE 1

| Examples |
| --- |
| 1. A device including:<br>a current loop;<br>a component under test coupled within the current loop;<br>a variable impedance circuit coupled to receive at least a portion of the current of the current loop;<br>frequency response analyzer circuitry coupled to the component under test and the variable impedance circuit outside the current loop, the frequency response analyzer circuitry configured to:<br>drive the variable impedance circuit to generate an oscillating current component in the current of the current loop, the oscillating current component characterized by a test frequency;<br>perform impedance spectroscopy by:<br>varying the test frequency; and<br>while varying the test frequency, monitoring a frequency response of the component under test to the test frequency, where:<br>optionally, variable impedance circuit includes a variable resistor;<br>optionally, the variable impedance circuit is connected in parallel and/or series to the component under test; and<br>optionally, the component under test includes a membrane for electrolysis;<br>optionally, the component under test includes a membrane for an electrochemical process;<br>optionally, the component under test includes a membrane electrode assembly for an electrochemical process;<br>optionally, the component under test includes an electrochemical cell; and<br>optionally, the device is in accord with any other example in this table.<br>2. A method including<br>driving a variable impedance circuit to generate an oscillating current component in a current of a current loop, the variable impedance circuit coupled to receive at least a |

TABLE 1-continued

Examples portion of the current of the current loop, the oscillating current component
characterized by a test frequency;
performing impedance spectroscopy by:
varying the test frequency; and
while varying the test frequency, monitoring, using frequency response analyzer
circuitry, a frequency response of a component under test within the current
loop to the test frequency, where:
optionally, variable impedance circuit includes a variable resistor;
optionally, the variable impedance circuit is connected in parallel and/or series to the
component under test; and
optionally, the component under test includes a membrane for electrolysis;
optionally, the component under test includes a membrane for an electrochemical
process;
optionally, the component under test includes a membrane electrode assembly for an
electrochemical process;
optionally, the component under test includes an electrochemical cell; and
optionally, the device is in accord with any other example in this table.
3. A device including:
centralized frequency response analyzer circuitry multiplexed to multiple current loops
each including a respective component under test;
a multiplexer coupled to the centralized frequency response analyzer circuitry, the
multiplexer configured to multiplex the centralized frequency response analyzer
circuitry to multiple components under test each within respective current loops;
the centralized frequency response analyzer circuitry configured to:
for each of the multiple components under test:
drive, via a variable impedance circuit, an oscillating current component in the
respective current loop, the oscillating current component characterized by a
test frequency;
perform impedance spectroscopy on the component under test by:
varying the test frequency; and
while varying the test frequency, monitoring a frequency response of the
component under test to the test frequency, where:
optionally, variable impedance circuit includes a variable resistor;
optionally, the variable impedance circuit is connected in parallel and/or series to the
component under test; and
optionally, the multiple components under test include a membrane for electrolysis;
optionally, the multiple components under test include a membrane for an
electrochemical process;
optionally, multiple components under test include a membrane electrode assembly for
an electrochemical process;
optionally, multiple components under test include an electrochemical cell;
optionally, the variable impedance circuit includes a centralized variable impedance
circuit;
optionally, the variable impedance circuit is multiplexed to each of the multiple current
loops in series and/or parallel to the component under test;
optionally, the variable impedance circuit includes a dedicated variable impedance circuit
for an individual one of multiple components under test;
optionally, the device is in accord with the device of any of the other examples in this
table; and
optionally, the device used to perform the method of any of the other examples in this
table.
4. A method including implementing the device of any of the other examples in this
table.
5. The device or method of any of the other examples in this table, where the
current in the current loop during operation is:
optionally, less than 1 amp;
optionally, greater than 1 amp;
optionally, greater than 5 amps;
optionally, less than 10 amps;
optionally, greater than 10 amps;
optionally, less than 25 amps;
optionally, greater than 25 amps;
optionally, less than 50 amps;
optionally, greater than 50 amps;
optionally, less than 75 amps;
optionally, greater than 75 amps;
optionally, less than 100 amps;
optionally, greater than 100 amps;
optionally, less than 200 amps;
optionally, greater than 200 amps;
optionally, less than 500 amps;
optionally, greater than 500 amps
optionally, less than 1000 amps;
optionally, greater than 1000 amps;
optionally, less than 2000 amps;
optionally, greater than 2000 amps;
optionally, less than 5000 amps;
optionally, greater than 5000 amps;

TABLE 1-continued

Examples optionally, less than 10k amps;
optionally, greater than 10k amps;
optionally, less than 20k amps;
optionally, greater than 20k amps;
optionally, less than 35k amps;
optionally, greater than 35k amps;
optionally, less than 50k amps;
optionally, greater than 50k amps;
optionally, less than 100k amps; and
optionally, greater than 100k amps.
6. The device or method of any of the other examples in this table, where:
the variable impedance circuit is connected in parallel to the component under test and
configured to receive a portion of the current in the current loop; and
the portion of the current includes:
optionally, less than 1/10 of the current in the current loop;
optionally, greater than 1/10 of the current in the current loop;
optionally, less than 1/50 of the current in the current loop;
optionally, greater than 1/50 of the current in the current loop;
optionally, less than 1/100 of the current in the current loop;
optionally, greater than 1/100 of the current in the current loop;
optionally, less than 1/500 of the current in the current loop;
optionally, greater than 1/500 of the current in the current loop
optionally, less than 1/1000 of the current in the current loop;
optionally, greater than 1/1000 of the current in the current loop
optionally, less than 1/2000 of the current in the current loop;
optionally, greater than 1/2000 of the current in the current loop
optionally, less than 1/5000 of the current in the current loop;
optionally, greater than 1/5000 of the current in the current loop;
optionally, less than 1/10000 of the current in the current loop;
optionally, greater than 1/10000 of the current in the current loop
optionally, less than 1/20000 of the current in the current loop;
optionally, greater than 1/20000 of the current in the current loop
optionally, less than 1/50000 of the current in the current loop;
optionally, greater than 1/50000 of the current in the current loop
optionally, less than 1/100000 of the current in the current loop; and
optionally, greater than 1/100000 of the current in the current loop.
7. The device or method of any of the other examples in this table, where the
magnitude of the oscillating current component is a perturbation to the total current in
the current loop.
8. The device or method of any of the other examples in this table, where variable
impedance circuit includes a static base load and a variable perturbative load.
9. The device or method of any of the other examples in this table, where variable
impedance circuit is coupled to the component under test and is configured to receive
the entire current in the current loop.
10. The device or method of any of the other examples in this table, a path of the
frequency response contributes a phase shift in the frequency response with respect to
the oscillating current component, where:
optionally, the phase-shift includes a 180 degree phase shift;
optionally, the phase-shift includes a phase shift due to the direction of current flow of
the frequency response along the path with respect to a direction of the oscillating
current component;
optionally, performing impedance spectroscopy includes accounting for the phase shift in
a frequency response analysis;
optionally, the path includes a phase shifter that compensates for the phase shift;
optionally, a driving signal for the oscillating current component from the frequency
response analyzer is phase-shifted before provision to the variable impedance circuit to
compensate for the phase shift;
optionally, one or more response monitoring leads between component under test and
the frequency response analyzer are reversed in polarity relative to that defined for the
oscillating current component.
11. The device or method of any of the other examples in this table, where each of the
multiple components under test are coupled to the multiplexer via an individual
dedicated test station, where:
optionally, the individual dedicated test station includes parallel circuit couplings for the
centralized variable impedance circuit;
optionally, the individual dedicated test station includes series circuit couplings for the
centralized variable impedance circuit.
12. A method including performing impedance spectroscopy with a frequency
response analyzer not located within the current loop of the component under test,
where:
optionally, the method is in accord with any other example in this table and/or
implements the device of any other example in this table.
13. A method including performing impedance spectroscopy with a centralized
frequency response analyzer multiplexed to multiple components under test, where:
optionally, the method is in accord with any other example in this table and/or
implements the device of any other example in this table.

One or more implementations of the disclosure may be referred to herein, individually and/or collectively, by the term "invention" merely for convenience and without intending to voluntarily limit the scope of this application to any particular invention or inventive concept. Moreover, although specific implementations have been illustrated and described herein, it should be appreciated that any subsequent arrangement designed to achieve the same or similar purpose may be substituted for the specific implementations shown. This disclosure is intended to cover any and all subsequent adaptations or variations of various implementations. Combinations of the above implementations, and other implementations not specifically described herein, are apparent to those of skill in the art upon reviewing the description.

As used herein, the singular forms "a," "an," and "the" include plural referents unless the context clearly dictates otherwise.

As used herein, "for example," "for instance," "such as," or "including" are meant to introduce examples that further clarify more general subject matter. Unless otherwise expressly indicated, such examples are provided only as an aid for understanding implementations illustrated in the present disclosure and are not meant to be limiting in any fashion. Nor do these phrases indicate any kind of preference for the disclosed implementations.

The Abstract of the Disclosure is provided to comply with 37 C.F.R. § 1.72 (b) and is submitted with the understanding that it will not be used to interpret or limit the scope or meaning of the claims. In addition, in the foregoing Detailed Description, various features may be grouped together or described in a single implementation for the purpose of streamlining the disclosure. This disclosure is not to be interpreted as reflecting an intention that the claimed implementations require more features than are expressly recited in each claim. Rather, as the following claims reflect, inventive subject matter may be directed to less than all of the features of any of the disclosed implementations. Thus, the following claims are incorporated into the Detailed Description, with each claim standing on its own as defining separately claimed subject matter.

It is intended that the foregoing detailed description be regarded as illustrative rather than limiting and that it is understood that the following claims including all equivalents are within the scope of the disclosure. The claims should not be read as limited to the described order or elements unless stated to that effect. Therefore, all implementations that come within the scope and spirit of the following claims and equivalents thereto are included within the disclosure.

The invention claimed is:

1. A device including:
a current loop;
a component under test coupled within the current loop;
a variable impedance circuit coupled to receive at least a portion of a current of the current loop; and
frequency response analyzer circuitry coupled to the component under test and the variable impedance circuit outside the current loop, the frequency response analyzer circuitry configured to:
drive the variable impedance circuit to generate a time-varying impedance to cause an oscillating current component in the current of the current loop, the oscillating current component characterized by a test frequency; and perform impedance spectroscopy by:
varying the test frequency; and
while varying the test frequency, monitoring a frequency response of the component under test to the test frequency.

2. The device of claim 1, where a magnitude of the oscillating current component is a perturbation to a total current in the current loop.

3. The device of claim 1, where the variable impedance circuit includes a static base load and a variable perturbative load.

4. The device of claim 1, a path of the frequency response contributes a phase shift in the frequency response with respect to the oscillating current component.

5. The device of claim 4, where the phase shift includes a 180 degree phase shift.

6. The device of claim 4, where the phase shift includes a phase shift due to a direction of current flow of the frequency response along the path with respect to a direction of the oscillating current component.

7. The device of claim 4, where the frequency response analyzer circuitry is further configured to perform the impedance spectroscopy by accounting for the phase shift in a frequency response analysis.

8. The device of claim 4, where the path includes a phase shifter configured to compensate for the phase shift.

9. The device of claim 4, where a driving signal for the oscillating current component from the frequency response analyzer circuitry is phase-shifted before provision to the variable impedance circuit to compensate for the phase shift.

10. The device of claim 4, where one or more response monitoring leads between component under test and the frequency response analyzer circuitry are reversed in polarity relative to a polarity defined for the oscillating current component.

11. A method including:
driving a variable impedance circuit to generate a time-varying impedance to cause an oscillating current component in a current of a current loop, the variable impedance circuit coupled to receive at least a portion of the current of the current loop, the oscillating current component characterized by a test frequency; and
performing impedance spectroscopy by:
varying the test frequency; and
while varying the test frequency, monitoring, using frequency response analyzer circuitry, a frequency response of a component under test within the current loop to the test frequency.

12. The method of claim 11, where a magnitude of the oscillating current component is a perturbation to a total current in the current loop.

13. The method of claim 11, where driving the variable impedance circuit includes generating a static base load and a variable perturbative load.

14. The method of claim 11, a path of the frequency response contributes a phase shift in the frequency response with respect to the oscillating current component.

15. The method of claim 14, where the phase shift includes a 180 degree phase shift.

16. The method of claim 14, where the phase shift includes a phase shift due to a direction of current flow of the frequency response along the path with respect to a direction of the oscillating current component.

17. A device including:
centralized frequency response analyzer circuitry multiplexed to multiple current loops each including a respective component under test; and
a multiplexer coupled to the centralized frequency response analyzer circuitry, the multiplexer configured to multiplex the centralized frequency response ana-
lyzer circuitry to multiple components under test each
within respective current loops,
wherein the centralized frequency response analyzer cir-
cuitry is configured to, for each of the multiple com-
ponents under test:
drive a variable impedance circuit to generate a time-
varying impedance to cause an oscillating current
component in the respective current loop, the oscil-
lating current component characterized by a test
frequency; and
perform impedance spectroscopy on the component
under test by:
varying the test frequency; and
while varying the test frequency, monitoring a fre-
quency response of the component under test to
the test frequency.

18. The device of claim 17, where each of the multiple
components under test are coupled to the multiplexer via an
individual dedicated test station; and
the variable impedance circuit includes a centralized
variable impedance circuit.

19. The device of claim 18, where each individual dedi-
cated test station includes a parallel circuit coupling to the
centralized variable impedance circuit.

20. The device of claim 17, where a path of the frequency
response contributes a phase shift in the frequency response
with respect to the oscillating current component.

* * * * *